United States Patent [19]

Seeger, Jr. et al.

[11] 3,818,279

[45] June 18, 1974

[54] ELECTRICAL INTERCONNECTION AND CONTACTING SYSTEM

[75] Inventors: Richard E. Seeger, Jr., Topsfield; William J. Lynn, Groveland, both of Mass.

[73] Assignee: Chromerics, Inc., Woburn, Mass.

[22] Filed: Feb. 8, 1973

[21] Appl. No.: 330,682

[52] U.S. Cl. ............ 317/101 CM, 29/625, 29/626, 174/68.5, 317/101 CE, 317/101 F

[51] Int. Cl. ............ H05k 1/04

[58] Field of Search 174/68.5; 317/101 CC, 101 CM, 317/101 CP, 101 CE, 101 B, 101 F; 337/17 C, 17 E, 17 CF, 61 M; 29/625, 626, 627, 588–590

[56] References Cited

UNITED STATES PATENTS 3,435,401 3/1969 Epstein ............ 174/68.5 UR 3,670,205 6/1972 Dixon et al. ............ 317/101 CE

*Primary Examiner*—Darrell L. Clay

*Attorney, Agent, or Firm*—Dike, Bronstein, Roberts & Cushman; Donald Brown

[57] ABSTRACT

Electrical interconnection and contacting system comprising an insulator flexible plastic, most preferably elastomeric material substrate having at least one layer of electrically conductive elastomeric material embedded therein. The present invention is useful in coupling integrated circuits or the like together or to other circuitry.

12 Claims, 9 Drawing Figures

ELECTRICAL INTERCONNECTION AND CONTACTING SYSTEM

BACKGROUND OF THE DISCLOSURE

The present invention is directed to a new and improved multi-layer flexible plastic, most preferably elastomeric electrical interconnection and contacting system. The system of this invention forms a multi-layer flexible or conformable mass which is useful in the mounting and interconnection of integrated circuits or the connection of integrated circuits to circuitry supported by the interconnection system or external to the interconnection system.

Over the years and particularly since the development of integrated circuits, there has developed a demand for improved electrical interconnection systems. The demand has particularly developed for interconnection systems which can do away soldering and wiring conventionally used to interconnect electrical components.

Although the old system using wire, solder or both is quite adequate in certain cases it has proven most inadequate when it is desired to remove integrated circuits from printed circuit boards without destroying at least some of the circuits. While this may appear to be of little consequence the cost of integrated circuits makes it imperative that a new interconnection system be devised which will permit integrated circuits to be saved and used again.

In addition there has also developed a demand for new and improved flexible or elastomeric systems instead of rigid systems to support circuitry for interconnection to other devices e.g., integrated circuits, displays, etc.

In view of the foregoing the present invention provides a new and improved polymeric material e.g., plastic and most preferably elastomeric electrical interconnection and electrical contacting system. The present system does away with wire bonds, packages, lead frames, connectors or sockets and also printed circuit boards. With the present invention all of the above are incorporated into the elastomeric system.

In addition in this system specified portions of various circuit layers can be embedded into the non-conductive substrate thus providing a truly planar multi-layer circuit board leaving the top surface flat for subsequent circuit layers or for interconnector to integrated circuits or other electrical devices such as displays e.g., liquid crystals.

As a further advantage of the present invention many layers of circuitry may be embedded by placing alternate layers of conductive and non-conducting elastomers within the non-conductive elastomeric substrate thus providing a substantial improvement over printed circuits (which are generally limited to two layers of circuitry).

Yet another advantage of the present invention is that it is still essentially an elastomer and thus the topmost circuit layers can be used as electrical contacts since they will conform to the surface of mating contacts.

As used herein the term plastic is meant to define flexible form stable thermoplastics and thermosetting plastics such as polythylene, polyproplene, nylon, polyesters as well as elastomers or rubbers such as natural rubber, silicone rubber, nitrile rubber, polyurethanes, butyl rubbers, etc.

BRIEF DESCRIPTION OF THE DISCLOSURE

Broadly this invention utilizes electrically conductive and electrically non-conductive or insulator plastic preferably elastomeric materials to provide a flexible, bendable and elastomeric electrical interconnection system. In the preferred embodiment at least one circuit layer of electrically conductive flexible elastomeric material is embedded in a flexible insulator plastic preferably elastomeric substrate to provide circuit interconnections at the top level of the substrate.

In an other embodiment the interconnection system is shown coupling a display device to a circuit board.

DETAILED DESCRIPTION OF THE PREFERRED EMBODIMENT

Figure 1:
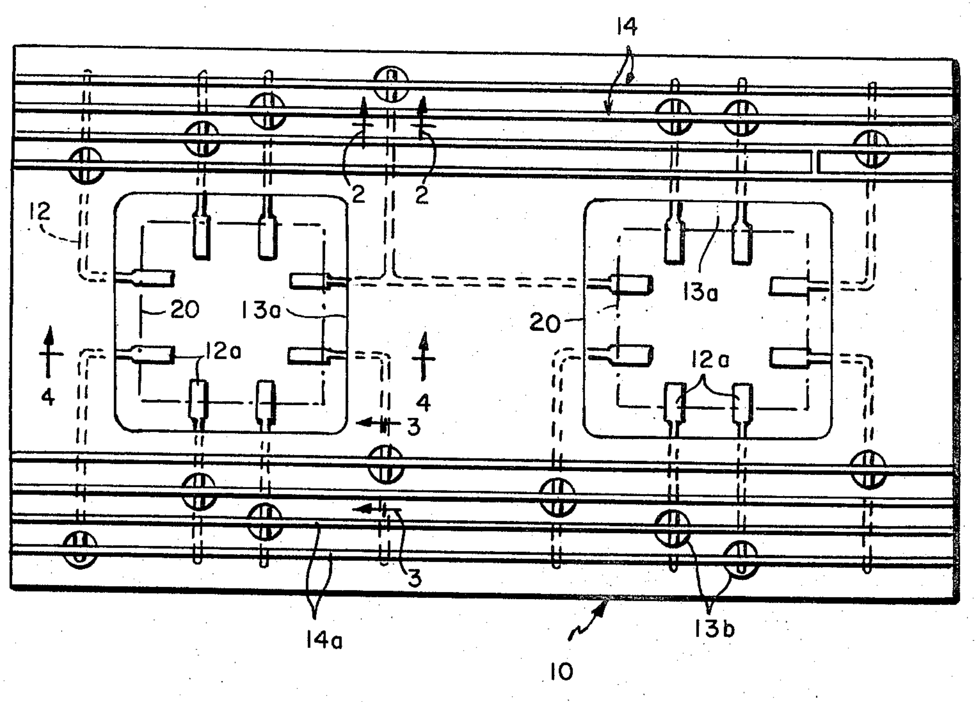
FIG. 1 is a top view of the interconnection system of the invention.
Figure 2:
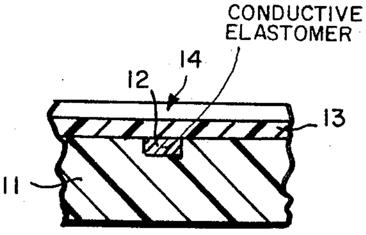
FIG. 2 is a sectional view taken along line 2—2 in FIG. 1.

Reference should now be had to FIGS. 1–4 for a description of the disclosure. At 10 there is shown an electrical interconnection system which in the preferred embodiment discloses a system for interconnecting two integrated circuits or the like to a coupling means. At 11 there is disclosed an insulator or an electrically non-conductive plastic and in this case elastomeric substrate or carrier and which preferably has been transformed by a process known as curing from a readily deformable condition (paste or liquid) into a resilient elastic condition. Elastomeric is the adjective form of elastomer and is meant herein to define an elastic rubber-like substance such as a synthetic rubber or a plastic having some of the properties of natural rubber. Examples of elastomeric materials suitable for the practice of this invention include silicone rubbers, nitrile rubbers, butyl rubbers, butadiene-styrene rubbers, etc. The selection of the elastomeric material to be used will depend in most cases on the end use conditions and cost factors as is well known to those skilled in the art. Embedded within the substrate as shown in the preferred embodiment is an electrically conductive flexible elastomeric material layer 12 forming a circuit or connections to which an integrated circuit or the like may be coupled. As may be seen in FIG. 1 the layer 12 may comprise separate elements or interconnected elements. No matter what form the elements take they are referred to for purpose of this invention as the conductive layer. The conductive elastomeric material of layer 12 may be the same or different than The elastomeric material 11 and may comprise any suitable conventional elastomeric material (which may be cured) such as described above with reference to layer 11. For example, nitrile rubber, silicone rubber, etc. may be used. In order to make layer 12 electrically conductive for the purposes of this invention, electrically conductive particles are added and may include materials such as silver, gold, the noble metals, as well as copper, metal coated conductive particles, e.g. silver coated, and carbon black, all of which for the purposes of this invention will be called electrically conductive particles. When the terms electrically conductive layer or conductive layer is used herein it is meant to define elastomeric material containing electrically conductive particles.

In this invention the electrical conductive particles are preferably in the form of a powder and most preferably have a maximum dimension of between 0.1 $\mu$ to 10 $\mu$ in any direction. Preferably the electrically conductive layer has a volume resistivity less than 10 ohm centimeters, more preferably less than 0.1 ohm centimeters, and most preferably less than 0.01 ohm centimeters. Most preferably the amount of electrically conductive particles will range between 20 to 80 volume percent of the elastomer of layer 12. In addition to conductive particles, electrically non-conductive extender particles such as silica, plastics, etc. may be added so long as the elastomeric and electrical properties of the material are not substantially reduced.

Above this layer 12 there is provided an insulator or electrically non-conductive elastomeric layer 13 having one or more holes or windows 13*a* extending therethrough. The layer 13 may be of the same elastomeric material as the material 11 or a different elastomeric material.

Figure 3:
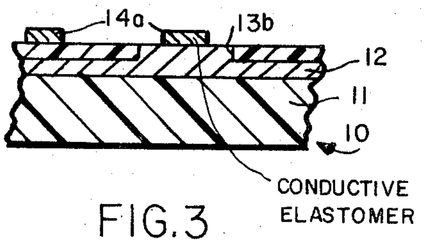
FIG. 3 is a sectional view taken along line 3—3 in FIG. 1.

The two layers 12 and 13 are supported by the substrate 11 as shown and embedded therein with the layer 13 extending to the surface and the layer 12 extending from a point below the layer 13 through the windows 13*a* to provide electrically conductive elastomeric contacts 12*a* at the same flat surface of the substrate (See FIGS. 3 and 4).

Figure 4:
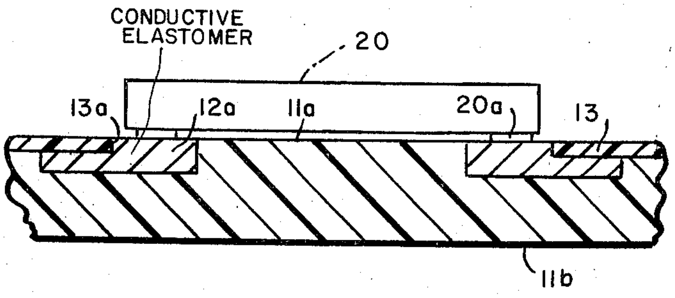
FIG. 4 is a sectional view taken along line 4—4 in FIG. 1.

In addition, as may be seen in FIGS. 1 and 4, the non-conductive substrate layer 11 also extends to the surface 11*a* through the hole 13*a* to hold the contacts 12*a* in place within the system. As a further feature the embodiment of FIG. 1 discloses circuitry 14 (e.g. a plurality of circuit elements or wires interconnected or not interconnected) positioned on top surface of the substrate (either on the layer 11 or 13) to interconnect external electrical devices (e.g. through input or output lines) to the electrical contacts 12*a* via contacts 12*b* extending upwardly through the holes 13*b* (See FIG. 3) of the circuit layer 12. The electrically conductive circuit or layer 14 is also constructed of a elastomeric conductive material of any of the same compositions useful in preparing conductive elastomeric layer 12.

In FIG. 4 there is shown dotted at 20 an illustration of a typical integrated circuit package having contacts 20*a* coupled to contacts 12*a*. In this manner integrated circuits, displays and a whole host of electronic devices may be coupled to the interconnection system 10. The integrated circuit may be adhesively held to the substrate or may be held thereto by conventional clamps, screwdowns, etc. as will be apparent to those skilled in the art.

Figure 5:
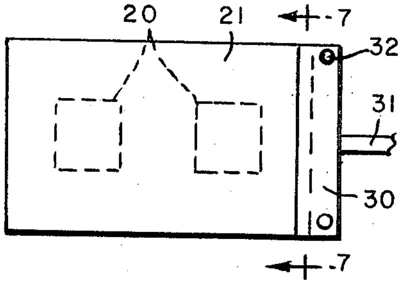
FIG. 5 illustrates two integrated circuits mounted on the interconnector below a cover and coupled to clamp coupling type electrical means.
Figure 6:
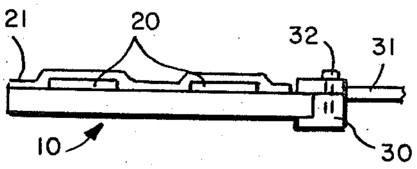
FIG. 6 is a side view of FIG. 5.
Figure 7:
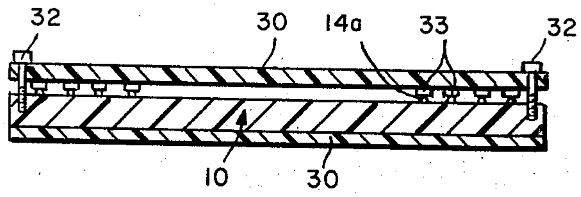
FIG. 7 is a sectional view taken along line 7—7 of FIG. 5.

Reference should now be had to FIGS. 5–7 which illustrates the elastomeric interconnection system of FIGS. 1–4 coupled to two integrated circuits and having circuit members 14*a* coupled to electrical contacts 33 of a rigid plastic clampdown type of connector 30 having a screw-down 32. At 31 electrical input and output lines are brought into the connector and soldered in a conventional manner to contacts 33. The integrated circuits are held down and covered by a plastic cover 21 which preferably adhesively adheres to the substrate top surface and is preferably peelable therefrom so as to be able to remove at least one of the normally expensive integrated circuits for reuse in case of failure of one of the integrated circuits.

Figure 8:
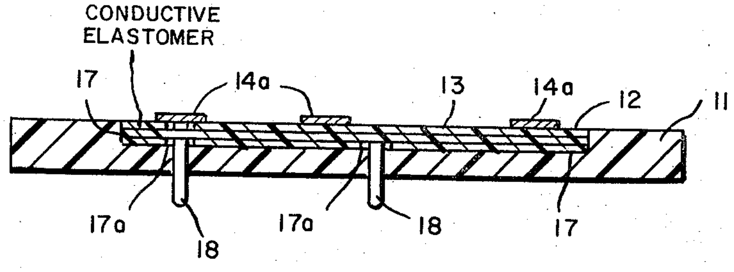
FIG. 8 is a sectional view similar to FIG. 3 showing pins coupled to the elastomeric conductive layer.

Reference should now be had to FIG. 8 which illustrates electrical connecting pins 18 which extend through another nonconductive layer 17*a* embedded within the substrates and having windows or holes 17*a*. In this manner the interconnecting system may be mounted for coupling to another type of electrical pin receiving connector.

Figure 9:
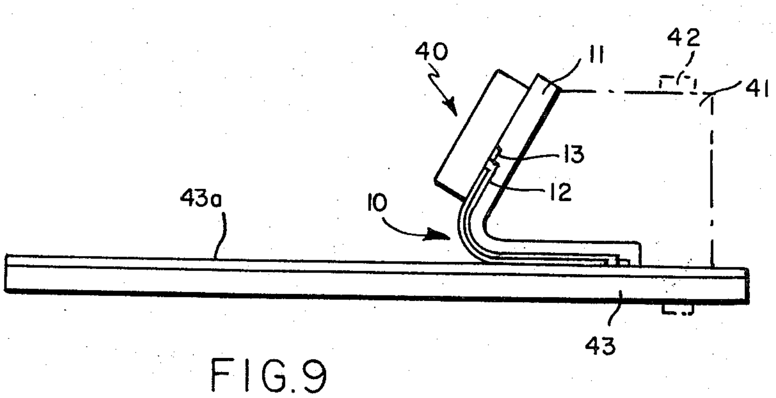
FIG. 9 shows the interconnection system of the invention wrapped around a support to interconnect two electrical devices.

In FIG. 9 there is shown the coupling of a display 40, e.g. a liquid crystal display package to a conventional circuit board by the elastomer interconnector 10 of this invention. As shown, the interconnector 10 is wrapped around a support 41 and clamped by screw 42 to a circuit board 43 having a conductive element (e.g. copper) mounted on the surface thereof. The system 10 illustrates the elastomeric substrate 11 with layer 13 provided with two windows through which layer 12 extends to make contact with the contacts of display 40 and board 43.

In order to construct the device of this invention various conventional techniques known to those skilled in the molding art may be employed such as (1) coating layer 13 on a base and then curing, (2) then coating layer 12 thereover in the pattern desired and then curing it, (3) and then the base carrying the layers 12 and 13 may be inserted in the bottom of a cavity mold (the same size as the base) and the mold may then be filled with uncured elastomeric resin which is then cured. The interconnection system or mass so produced is removed from the mold and then peeled from the base as is conventional in the art.

We claim:

1. An electrical interconnector and contacing system comprising a non-conductive flexible plastic material substrate having at least one layer of electrically conductive flexible elastomeric material embedded therein, a flexible layer of non-conductive plastic material also embedded therein and positioned on the electrically conductive layer and having at least one hole extending therethrough in alignment with a portion of said conductive layer, said portion of electrically conductive layer in alignment with said hole extending through said hole to the top surface of said substrate to provide an electrical contact.

2. A system according to claim 1 in which the plastic material is elastomeric material.

3. A system according to claim 2 in which the hole is wider than the portion of the electrical conductive material extending to the top surface of the substrate and in which the substrate also extends through said hole to locate said surface electrical conductive layer portion.

4. A system according to claim 3 in which another layer of electrically conductive flexible elastomeric plastic material is positioned on the substrate top in contact with the electrically conductive layer extending through the hole.

5. A system according to claim 1 in which an integrated circuit is mounted on the top of the substrate with at least one contact of the integrated circuit in contact with the electrical conductive layer extending to the substrate surface.

6. A system according to claim 5 in which a layer holds the integrated circuit on the elastomeric substrate and is coupled to the substrate.

7. A system according to claim 1 in which at least one electrical contactor pin extends through the bottom of the substrate to make electrical contact with the conductive layer.

8. A system according to claim 1 in which the hole is wider than the portion of the electrical conductive material extending to the top surface of the substrate and in which the substrate also extends through said hole to locate said surface electrical conductive layer portion.

9. A system according to claim 8 in which said at least one layer of electrically conductive flexible elastomeric material comprises a plurality of conductive layers spaced apart from each other, in which the said hole of said flexible layer is in alignment with a portion of each of said plurality of conductive layers, in which said portion of each of conductive layers extends through said hole to the top surface of said substrate to provide a plurality of spaced apart contacts and in which the substrate also extends through said hole to locate each of said plurality of said surface electrical conductive layer portions.

10. A system according to claim 9 in which the plastic material is elastomeric material.

11. A system according to claim 1 in which said flexible layer has at least two holes extending therethrough in alignment with different portions of said layer of electrically conductive elastomeric material, said portions of said electrically conductive layer in alignment with each of said holes extending through said holes to the top surface of said substrate to provide electrical contacts.

12. A system according to claim 11 in which the plastic material is elastomeric material.

* * * * *